US012812781B2

(12) United States Patent
Kawase et al.

(10) Patent No.: US 12,812,781 B2
(45) Date of Patent: Nov. 24, 2026

(54) WIRING BOARD AND MOUNTING STRUCTURE

(71) Applicant: KYOCERA CORPORATION, Kyoto (JP)

(72) Inventors: Aki Kawase, Kyoto (JP); Makoto Shiroshita, Otsu (JP)

(73) Assignee: KYOCERA CORPORATION, Kyoto (JP)

( * ) Notice: Subject to any disclaimer, the term of this patent is extended or adjusted under 35 U.S.C. 154(b) by 203 days.

(21) Appl. No.: 18/859,809

(22) PCT Filed: Apr. 21, 2023

(86) PCT No.: PCT/JP2023/015908
§ 371 (c)(1),
(2) Date: Oct. 24, 2024

(87) PCT Pub. No.: WO2023/210526
PCT Pub. Date: Nov. 2, 2023

(65) Prior Publication Data

US 2025/0267792 A1 Aug. 21, 2025

(30) Foreign Application Priority Data

Apr. 28, 2022 (JP) ................................ 2022-074443

(51) Int. Cl.

| | |
|---|---|
| ***H05K 1/14*** | (2006.01) |
| ***G01R 31/28*** | (2006.01) |
| ***H05K 1/02*** | (2006.01) |
| ***H05K 1/11*** | (2006.01) |

(52) U.S. Cl.
CPC ......... *H05K 1/116* (2013.01); *G01R 31/2815* (2013.01); *H05K 1/0219* (2013.01); *H05K 1/0245* (2013.01); *H05K 1/141* (2013.01); *H05K 2201/0939* (2013.01); *H05K 2201/09454* (2013.01); *H05K 2201/09527* (2013.01); *H05K 2201/09618* (2013.01)

(58) Field of Classification Search
CPC . H05K 1/115; H05K 1/141; H05K 2201/0939
See application file for complete search history.

(56) References Cited

FOREIGN PATENT DOCUMENTS

JP 5361023 B2 12/2013

*Primary Examiner* — Jeremy C Norris
(74) *Attorney, Agent, or Firm* — Volpe Koenig

(57) ABSTRACT

A wiring board according to the present disclosure has a layered structure in which a plurality of insulation layers and a plurality of electrical conductor layers are alternately layered. The plurality of electrical conductor layers include a first signal wire. The first signal wire includes a first electrode, a second electrode, a protruding portion, a wire-shaped electrical conductor having a first end and a second end, a third electrode, a first via-hole electrical conductor, a second via-hole electrical conductor, and a third via-hole electrical conductor. The first electrode and the third electrode are connected by a first wiring pattern including the first via-hole electrical conductor. The protruding portion and the first end of the wire-shaped electrical conductor are connected by the second via-hole electrical conductor. The second end of the wire-shaped electrical conductor and the second electrode are connected by the third via-hole electrical conductor.

8 Claims, 2 Drawing Sheets

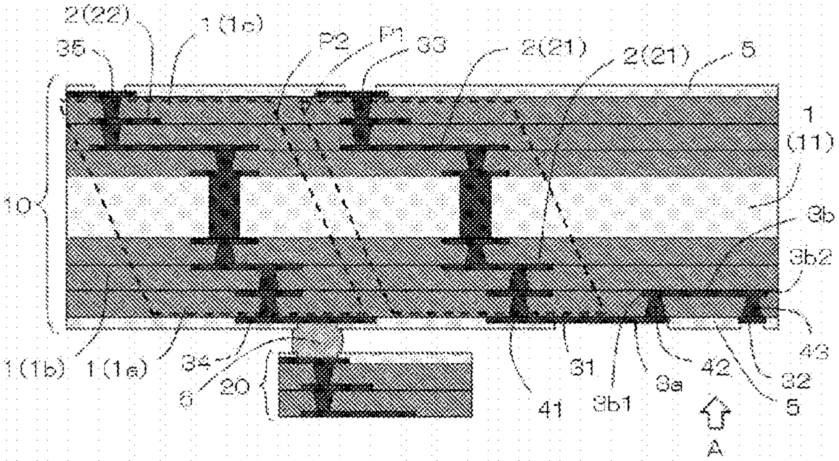
FIG. 1
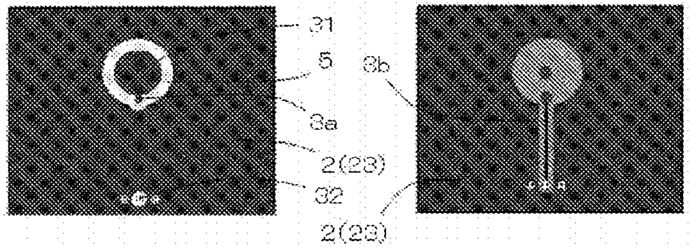
FIG. 2A
FIG. 2B
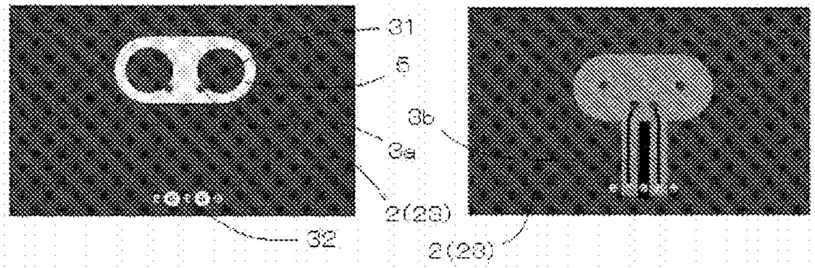
FIG. 3A
FIG. 3B

WIRING BOARD AND MOUNTING STRUCTURE

TECHNICAL FIELD

The present invention relates to a wiring board and a mounting structure using the wiring board.

BACKGROUND OF INVENTION

In a wiring board for mounting an electronic component such as a semiconductor element, inspection needs to be performed to inspect whether or not a signal is transmitted as designed. For example, as described in Patent Document 1, such inspection is performed using a measurement pad formed at an end portion of the wiring board.

CITATION LIST

Patent Literature

Patent Document 1: JP 5361023 B

SUMMARY

Solution to Problem

A wiring board according to the present disclosure has a layered structure in which a plurality of insulation layers and a plurality of electrical conductor layers are alternately layered. The plurality of insulation layers include at least a first insulation layer located at a lowermost layer, a second insulation layer located one layer above the first insulation layer, and a third insulation layer located at an uppermost layer and including a mounting region. The plurality of electrical conductor layers include a first signal wire. The first signal wire includes a first electrode and a second electrode each located on a lower surface of the first insulation layer, a protruding portion located on the lower surface of the first insulation layer and located to be in contact with the first electrode, a wire-shaped electrical conductor located between the first insulation layer and the second insulation layer and having a first end and a second end, a third electrode located on an upper surface of the third insulation layer, and a first via-hole electrical conductor, a second via-hole electrical conductor, and a third via-hole electrical conductor each located to penetrate an upper surface and the lower surface of the first insulation layer. The first electrode and the third electrode are connected by a first wiring pattern including the first via-hole electrical conductor. The protruding portion and the first end of the wire-shaped electrical conductor are connected by the second via-hole electrical conductor. The second end of the wire-shaped electrical conductor and the second electrode are connected by the third via-hole electrical conductor.

A mounting structure according to the present disclosure includes the wiring board described above and an electronic component located at the mounting region of the wiring board.

BRIEF DESCRIPTION OF THE DRAWINGS

FIG. 1 is an explanatory view for illustrating a main portion of a wiring board according to one embodiment of the present disclosure.

FIGS. 2A and 2B are each a plan view illustrating an example as seen along an arrow A in FIG. 1.

FIGS. 3A and 3B are each a plan view illustrating another example as seen along the arrow A in FIG. 1.

DESCRIPTION OF EMBODIMENTS

Figure 4:
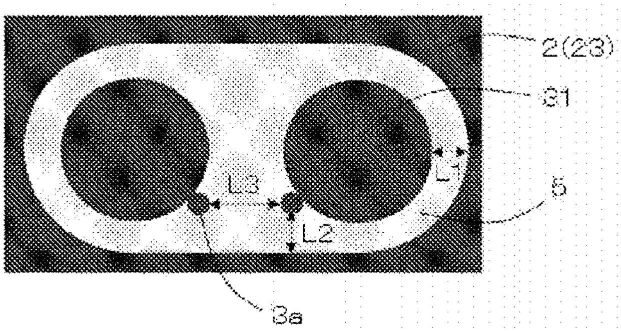
FIG. 4 is an explanatory view for illustrating the shortest distance between a first electrode and a grounding electrical conductor, the shortest distance between a protruding portion and the grounding electrical conductor, and the shortest distance between the protruding portions in a paired electrode.

In a known wiring board, a measurement pad is formed at the end portion of the wiring board, and the pattern of a measurement wiring path is greatly different from the actual product pattern. Although measuring electrical characteristics in a state where a signal pad is surrounded by a ground conductor is desirable, a part of the signal pad is not surrounded by a ground conductor layer in a known inspection. When a part of the signal pad is not surrounded by the ground conductor as described above, the electrical characteristics are deteriorated. Therefore, the wiring board is demanded in which the pattern of the measurement wiring path is close to the actual product pattern and accurate electrical characteristics can be measured.

The wiring board according to the present disclosure has a configuration as described in the section of SOLUTION TO PROBLEM, so that the pattern of the measurement wiring path is close to the actual product pattern, and accurate electrical characteristics can be measured. In the mounting structure according to the present disclosure, an electronic component is mounted on the wiring board in which the accurate electrical characteristics are measured. Therefore, the mounting structure according to the present disclosure has excellent electrical reliability and can reduce defects such as malfunction of the electronic component.

A wiring board according to one embodiment of the present disclosure will be described with reference to FIGS. 1, 2A, 2B, 3A, 3B, and 4. FIG. 1 is an explanatory view for illustrating a wiring board 10 according to one embodiment of the present disclosure. Specifically, FIG. 1 illustrates the vicinity of a region connected to a measuring equipment in order to perform inspection (electrical characteristic measurement) of whether or not a signal is transmitted as designed.

As illustrated in FIG. 1, in one embodiment, the wiring board 10 has a layered structure in which a plurality of insulation layers 1 and a plurality of electrical conductor layers 2 are alternately layered. As illustrated in FIG. 1, the insulation layer 1 includes, for example, a core insulation layer 11 and a build-up insulation layer layered on at least one main surface of the core insulation layer 11. For example, in one embodiment, as illustrated in FIG. 1, the wiring board 10 is connected to a motherboard 20 via solder 6.

The insulation layer 1 is formed of a resin such as an epoxy resin, a bismaleimide-triazine resin, a polyimide resin, a polyphenylene ether resin, or a liquid crystal polymer. These resins may be used alone or in a combination of two or more. Insulation particles may be dispersed in the insulation layer 1. The insulation particles are not limited, and examples thereof may include inorganic insulation fillers made of silica, alumina, barium sulfate, talc, clay, glass, calcium carbonate, and titanium oxide. The core insulation layer 11 and the build-up insulation layer may be formed of the same resin or different resins. Layers forming the build-up insulation layer may be formed of the same resin or different resins.

The insulation layer 1 may contain a reinforcing material. Examples of the reinforcing material include insulation fabric materials such as glass fiber, glass non-woven fabric, aramid non-woven fabric, aramid fiber, and polyester fiber. Two or more types of reinforcing materials may be used in combination. An inorganic insulation filler made of, for example, silica, barium sulfate, talc, clay, glass, calcium carbonate, or titanium oxide may be dispersed in the insulation layer 1.

When the insulation layer 1 is the core insulation layer 11, the core insulation layer 11 has a thickness of, for example, 200 μm or more and 1400 μm or less. The core insulation layer 11 includes a through hole electrical conductor for electrically connecting the electrical conductor layers 2 located on upper and lower surfaces of the core insulation layer 11. The through hole electrical conductor is located in a through hole penetrating through the upper and lower surfaces of the core insulation layer 11. The through hole electrical conductor is formed of a conductor made of metal plating such as copper plating, for example. The through hole electrical conductor is connected to the electrical conductor layers 2 on both the surfaces of the core insulation layer 11. The through hole electrical conductor may be formed only on an inner wall surface of the through hole, or the through hole may be filled with the through hole electrical conductor.

When the insulation layer 1 is a build-up insulation layer, the build-up insulation layer has a thickness of, for example, 5 μm or more and 100 μm or less. Layers forming the build-up insulation layer may be formed of the same resin or different resins. The build-up insulation layer includes a via-hole electrical conductor for electrically connecting the electrical conductor layers 2 located above and below the build-up insulation layer. The via-hole electrical conductor is obtained by precipitating, for example, copper plating in a via-hole penetrating through upper and lower surfaces of the build-up insulation layer. As illustrated in FIG. 1, the via-hole electrical conductor may be located filling the via-hole, or the via-hole electrical conductor may be adhered to an inner surface of the via-hole and a portion of the via-hole where the via-hole electrical conductor is not provided may be filled with a resin.

The electrical conductor layers 2 are located on main surfaces of the insulation layers 1, that is, on each of a main surface of the core insulation layer 11 and a main surface of the build-up insulation layer. The electrical conductor layer 2 is formed of copper such as a copper foil or copper plating. The thickness of the electrical conductor layer 2 is not particularly limited, and is, for example, 3 μm or more and 30 μm or less.

Solder resists 5 are located on part of both the upper and lower surfaces of the wiring board 10. The solder resist 5 is made of, for example, an acryl-modified epoxy resin. The solder resist 5 has, for example, a function of protecting the electrical conductor layers 2 from adhesion of the solder 6 when an electronic component is mounted. The solder resist 5 has an opening. The electrical conductor layer 2 exposed from the opening functions as an electrode.

In the wiring board 10 according to one embodiment, the insulation layers 1 include at least a first insulation layer 1*a* located at the lowermost layer, a second insulation layer 1*b* located one layer above the first insulation layer 1*a*, and a third insulation layer 1*c* located at the uppermost layer and including a mounting region. Specifically, as illustrated in FIG. 1, among the build-up insulation layers layered on the lower surface of the core insulation layer 11, the outermost build-up insulation layer corresponds to the first insulation layer 1*a*. The build-up insulation layer located on one layer inside (core insulation layer 11 side) of the first insulation layer 1*a* corresponds to the second insulation layer 1*b*. Among the build-up insulation layers layered on the upper surface of the core insulation layer 11, the outermost build-up insulation layer corresponds to the third insulation layer 1*c*.

In the wiring board 10 according to one embodiment, the electrical conductor layer 2 includes a first signal wire 21 for electrical measurement. The first signal wire 21 includes a first electrode 31, a second electrode 32, a third electrode 33, a protruding portion 3*a*, a wire-shaped electrical conductor 3*b*, a first via-hole electrical conductor 41, a second via-hole electrical conductor 42, and a third via-hole electrical conductor 43. That is, the first signal wire 21 is a continuous wiring path from the second electrode 32 to the third electrode 33 illustrated in FIG. 1.

The first electrode 31 and the second electrode 32 are located on the lower surface of the first insulation layer 1*a*. The first electrode 31 and the second electrode 32 are exposed from the openings of the solder resist 5. The first electrode 31 and the second electrode 32 are connected to each other via the wire-shaped electrical conductor 3*b* as illustrated in FIG. 1.

The wire-shaped electrical conductor 3*b* is located between the first insulation layer 1*a* and the second insulation layer 1*b*. The wire-shaped electrical conductor 3*b* and the first electrode 31 are connected to each other through the protruding portion 3*a* located in contact with the first electrode 31 and the second via-hole electrical conductor 42. The second via-hole electrical conductor 42 is connected to the wire-shaped electrical conductor 3*b* in the vicinity of a first end 3*b*1. The wire-shaped electrical conductor 3*b* and the second electrode 32 are connected to each other through the third via-hole electrical conductor 43. The third via-hole electrical conductor 43 is connected to the wire-shaped electrical conductor 3*b* in the vicinity of a second end 3*b*2. The first electrode 31 and the third electrode 33 that is located on the upper surface of the third insulation layer 1*c* are connected to each other by a first wiring pattern P1 including the first via-hole electrical conductor 41. That is, the first wiring pattern P1 refers to a continuous wiring path from the first via-hole electrical conductor 41 to the via-hole electrical conductor connected to the third electrode 33 illustrated in FIG. 1.

As illustrated in FIGS. 2A and 2B, the electrical conductor layer 2 may further include a grounding electrical conductor 23. FIGS. 2A and 2B are each a plan view illustrating an example as seen along the arrow A in FIG. 1. FIG. 2A illustrates the electrical conductor layer 2 on the lowermost surface, FIG. 2B illustrates one layer inside (core insulation layer 11 side) from the electrical conductor layer 2 on the lowermost surface, and each illustrates the vicinity of the first electrode 31 and the second electrode 32.

The grounding electrical conductors 23 are located, for example, on the lower surface of the first insulation layer 1*a* and between the first insulation layer 1*a* and the second insulation layer 1*b*. As illustrated in FIGS. 2A and 2B, the grounding electrical conductor 23 is located to surround both sides of the wire-shaped electrical conductor 3*b* and the first electrode 31 in a plan view. "The grounding electrical conductor 23 located on both sides of the wire-shaped electrical conductor 3*b*" means, for example, the grounding electrical conductor 23 located in the left and right directions along the longitudinal direction of the wire-shaped electrical conductor 3*b* in FIG. 2B. When the grounding electrical conductor 23 is located to surround both sides of the wire-shaped electrical conductor 3*b* and the first electrode 31 as described above, the electrical characteristics can be measured more accurately.

The first electrode 31 may be a single electrode as illustrated in FIGS. 2A and 2B, or may be a paired electrode including two electrodes located adjacent to each other in which the protruding portion 3*a* may be in contact with each of the two electrodes as illustrated in FIGS. 3A and 3B. FIGS. 3A and 3B are each a plan view illustrating another example as seen along the arrow A in FIG. 1. FIG. 3A illustrates the electrical conductor layer 2 on the lowermost surface, FIG. 3B illustrates one layer inside (core insulation layer 11 side) from the electrical conductor layer 2 on the lowermost surface, and each illustrates the vicinity of the first electrode 31 and the second electrode 32.

When the first electrode 31 is a paired electrode, a high-frequency signal can be efficiently transmitted using a differential signal line.

The position of the protruding portion 3*a* in contact with the first electrode 31 is not limited. For example, as illustrated in FIG. 4, the protruding portion 3*a* may be in contact with the first electrode 31 such that a first distance L1 that is the shortest distance between the grounding electrical conductor 23 and the first electrode 31 is shorter than a second distance L2 that is the shortest distance between the grounding electrical conductor 23 and the protruding portion 3*a*. When the protruding portion 3*a* is in contact with the first electrode 31 such that the first distance L1 is shorter than the second distance L2, the electrical characteristics can be measured more accurately.

The first electrode 31 and the protruding portion 3*a* are in contact with each other, and the first electrode 31 and the protruding portion 3*a* can be regarded as one electrode (pad). The first electrode 31 is connected to the first via-hole electrical conductor 41, and the protruding portion 3*a* is connected to the second via-hole electrical conductor 42. Accordingly, since two via-hole electrical conductors are connected to the electrode (pad) that appears as one, the adhesiveness of the first electrode 31 and the protruding portion 3*a* to the first insulation layer 1*a* can be improved.

The shape of the protruding portion 3*a* is not limited. As illustrated in FIGS. 3A, 3B and 4, the protruding portion 3*a* may have a circular shape. The circular shape enables more accurate measurement when measurement is performed using the de-embedded technique described below. When the first electrode 31 and the protruding portion 3*a* are regarded as one electrode (pad), the electrode may have a teardrop shape. By adopting the teardrop shape, the electrode is easily formed, and the peeling of the protruding portion 3*a* is reduced. For the same reason, the shape of the protruding portion 3*a* may have a quadrangular shape.

Accurate measurement becomes possible by making the protruding portion 3*a* as small as possible from the viewpoint of manufacturing. Therefore, the protruding portion 3*a* has a minimum necessary size to which the second via-hole electrical conductor 42 (to be connected to the protruding portion 3*a*) can be connected. For example, the protruding portion 3*a* may have a maximum width of about 100 μm. That is, in a plan view, the protruding portion 3*a* has a portion having a width greater than the maximum width of the second via-hole electrical conductor 42.

As illustrated in FIGS. 3A and 3B, when the first electrode 31 is a paired electrode, the protruding portion 3*a* may be in contact with the first electrode 31 such that the first distance L1 is shorter than a third distance L3 that is the shortest distance between the protruding portions 3*a* of the paired electrode. When the protruding portion 3*a* is in contact with the first electrode 31 such that the first distance L1 is shorter than the third distance L3, the electrical characteristics can be measured more accurately.

The first signal wire 21 is a circuit used for measuring electrical characteristics. Therefore, the first signal wire 21 is not connected to the electronic component and the motherboard 20. After the electronic component is mounted, signals are transmitted and received between the electronic component and the motherboard 20 via a second wiring pattern P2.

The second wiring pattern P2 connects a fourth electrode 34 located on the lower surface of the first insulation layer 1*a* and a fifth electrode 35 located on the upper surface of the third insulation layer 1*c*. That is, the second wiring pattern P2 is a continuous wiring path from the via-hole electrical conductor connected to the fourth electrode 34 to the via-hole electrical conductor connected to the fifth electrode 35. The second wiring pattern P2 is the same wiring path pattern as the first wiring pattern P1 that connects the first electrode 31 and the third electrode 33. In other words, the first wiring pattern P1 and the second wiring pattern P2 have the same configuration in terms of the wiring lengths, the wiring widths, and the sizes, the numbers, the arrangements, and the like of the via-hole electrical conductors.

The first wiring pattern P1, which is a pattern for electrical measurement, has the same wiring path pattern as the second wiring pattern P2, which is an actual product pattern, and thus electrical characteristics can be measured more accurately than in known wiring boards. The method for measuring the electrical characteristics is not limited, and for example, the measurement may be performed using the de-embedded technique in that the electrical characteristics can be measured more accurately.

In the de-embedded technique, first, the electrical characteristics of the first signal wire 21 (from the second electrode 32 to the third electrode 33) are measured to obtain a measurement value M1. Next, the electrical characteristics of a portion from the protruding portion 3*a* to the second electrode 32 are measured to obtain a measurement value M2. Thereafter, the measurement value M2 is subtracted from the measurement value M1 to obtain an electrical characteristic value between the first electrode 31 and the third electrode 33. In the wiring board 10 of the present disclosure, the first wiring pattern P1 connecting the first electrode 31 and the third electrode 33 has the same wiring path pattern as the second wiring pattern P2 connecting the fourth electrode 34 connected to the motherboard 20 and the fifth electrode 35 connected to the electronic component. Thus, by obtaining the electrical characteristic value between the first electrode 31 and the third electrode 33, the electrical characteristic value can be used as an electrical characteristic value closer to the electrical characteristic value between the third electrode 33 and the fifth electrode 35. Therefore, the wiring board 10 can be provided in which electrical characteristics can be measured accurately.

Next, a mounting structure of the present disclosure will be described. A mounting structure according to one embodiment includes the wiring board 10 according to one embodiment described above and the electronic component located at the mounting region of the wiring board 10.

Examples of the electronic component include semiconductor elements such as an Application Specific Integrated Circuit (ASIC), a semiconductor integrated circuit element, and an optoelectronic element. The electronic component is connected to the fifth electrode 35 by the solder 6. That is, as described above, the electronic component is not electrically connected to the first wiring pattern P1 but is electrically connected to the second wiring pattern P2.

In the mounting structure according to one embodiment, the electronic component is mounted on the wiring board 10 in which accurate electrical characteristics are measured. Therefore, the mounting structure according to one embodiment has excellent electrical reliability and can reduce defects such as malfunction of the electronic component.

An embodiment of the present disclosure has been described above. However, the invention according to the present disclosure is not limited to the above-described embodiment, and various modifications or improvements can be made within the scope of the present disclosure described in (1) and (7) below.

(1) A wiring board according to the present disclosure has a layered structure in which a plurality of insulation layers and a plurality of electrical conductor layers are alternately layered. The plurality of insulation layers include at least a first insulation layer located at a lowermost layer, a second insulation layer located one layer above the first insulation layer, and a third insulation layer located at an uppermost layer and including a mounting region. The plurality of electrical conductor layers include a first signal wire. The first signal wire includes a first electrode and a second electrode each located on a lower surface of the first insulation layer, a protruding portion located on the lower surface of the first insulation layer and located to be in contact with the first electrode, a wire-shaped electrical conductor located between the first insulation layer and the second insulation layer and having a first end and a second end, a third electrode located on an upper surface of the third insulation layer, and a first via-hole electrical conductor, a second via-hole electrical conductor, and a third via-hole electrical conductor each located to penetrate an upper surface and the lower surface of the first insulation layer. The first electrode and the third electrode are connected by a first wiring pattern including the first via-hole electrical conductor. The protruding portion and the first end of the wire-shaped electrical conductor are connected by the second via-hole electrical conductor. The second end of the wire-shaped electrical conductor and the second electrode are connected by the third via-hole electrical conductor.

With regard to embodiments of the present disclosure, the following embodiments (2) to (6) and (8) are further disclosed.

(2) In the wiring board according to (1) above, the plurality of electrical conductor layers further include a fourth electrode located on the lower surface of the first insulation layer and a fifth electrode located on the upper surface of the third insulation layer. The fourth electrode and the fifth electrode are connected by a second wiring pattern having a wiring path pattern identical to a wiring path pattern of the first wiring pattern.

(3) In the wiring board according to (1) or (2) above, the first electrode is a paired electrode including two electrodes located adjacent to each other, and the protruding portion is in contact with each of the two electrodes.

(4) In the wiring board according to any one of (1) to (3) above, the plurality of electrical conductor layers further include a grounding electrical conductor on the lower surface of the first insulation layer and between the first insulation layer and the second insulation layer. The grounding electrical conductor is located to surround both sides of the wire-shaped electrical conductor and the first electrode in a plan view.

(5) In the wiring board according to (4) above, a first distance that is the shortest distance between the first electrode and the grounding electrical conductor is shorter than a second distance that is the shortest distance between the protruding portion and the grounding electrical conductor.

(6) In the wiring board according to (4) or (5) above, the first electrode is a paired electrode including two electrodes located adjacent to each other, the protruding portion is in contact with each of the two electrodes, and the first distance that is the shortest distance between the first electrode and the grounding electrical conductor is shorter than a third distance that is the shortest distance between the protruding portion of one of the paired electrode and the protruding portion of the other of the paired electrode.

(7) A mounting structure according to the present disclosure includes the wiring board according to any one of (1) to (6) above, and an electronic component located at a mounting region of the wiring board.

(8) In the mounting structure according to (7) above, the electronic component is not electrically connected to the first wiring pattern and is electrically connected to the second wiring pattern.

REFERENCE SIGNS

1 Insulation layer
11 Core insulation layer
1*a* First insulation layer
1*b* Second insulation layer
1*c* Third insulation layer
2 Electrical conductor layer
21 First signal wire
22 Second signal wire
23 Grounding electrical conductor
31 First electrode
32 Second electrode
33 Third electrode
34 Fourth electrode
35 Fifth electrode
3*a* Protruding portion
3*b* Wire-shaped electrical conductor
3*b*1 First end
3*b*2 Second end
41 First via-hole electrical conductor
42 Second via-hole electrical conductor
43 Third via-hole electrical conductor
5 Solder resist
6 Solder
10 Wiring board
20 Motherboard
P1 First wiring pattern
P2 Second wiring pattern

The invention claimed is:

1. A wiring board comprising a layered structure in which a plurality of insulation layers and a plurality of electrical conductor layers are alternately layered, wherein the plurality of insulation layers comprise at least a first insulation layer located at a lowermost layer, a second insulation layer located one layer above the first insulation layer, and a third insulation layer located at an uppermost layer and comprising a mounting region, the plurality of electrical conductor layers comprise a first signal wire, the first signal wire comprises:

a first electrode and a second electrode each located on a lower surface of the first insulation layer;

a protruding portion located on the lower surface of the first insulation layer and located to be in contact with the first electrode;

a wire-shaped electrical conductor located between the first insulation layer and the second insulation layer and having a first end and a second end;

a third electrode located on an upper surface of the third insulation layer; and a first via-hole electrical conductor, a second via-hole electrical conductor, and a third via-hole electrical conductor each located to penetrate an upper surface and the lower surface of the first insulation layer, the first electrode and the third electrode are connected by a first wiring pattern comprising the first via-hole electrical conductor, the protruding portion and the first end of the wire-shaped electrical conductor are connected by the second via-hole electrical conductor, and the second end of the wire-shaped electrical conductor and the second electrode are connected by the third via-hole electrical conductor.

2. The wiring board according to claim 1, wherein the plurality of electrical conductor layers further comprise a fourth electrode located on the lower surface of the first insulation layer and a fifth electrode located on the upper surface of the third insulation layer, and the fourth electrode and the fifth electrode are connected by a second wiring pattern having a wiring path pattern identical to a wiring path pattern of the first wiring pattern.

3. The wiring board according to claim 1, wherein the first electrode is a paired electrode comprising two electrodes located adjacent to each other, and the protruding portion is in contact with each of the two electrodes.

4. The wiring board according to claim 1, wherein the plurality of electrical conductor layers further comprise a grounding electrical conductor on the lower surface of the first insulation layer and between the first insulation layer and the second insulation layer, and the grounding electrical conductor is located on both sides of the wire-shaped electrical conductor and surrounding the first electrode in a plan view.

5. The wiring board according to claim 4, wherein a first distance that is a shortest distance between the first electrode and the grounding electrical conductor is shorter than a second distance that is a shortest distance between the protruding portion and the grounding electrical conductor.

6. The wiring board according to claim 4, wherein the first electrode is a paired electrode comprising two electrodes located adjacent to each other, the protruding portion is in contact with each of the two electrodes, and the first distance that is the shortest distance between the first electrode and the grounding electrical conductor is shorter than a third distance that is a shortest distance between the protruding portion of one of the paired electrode and the protruding portion of the other of the paired electrode.

7. A mounting structure comprising:

the wiring board according to claim 1; and an electronic component located at the mounting region of the wiring board.

8. The mounting structure according to claim 7, wherein the electronic component is not electrically connected to the first wiring pattern and is electrically connected to the second wiring pattern.

* * * * *